(12) United States Patent
Song et al.

(10) Patent No.: US 11,467,296 B2
(45) Date of Patent: Oct. 11, 2022

(54) DETECTION DEVICE BASED ON THE PIEZOELECTRIC PROPERTY OF GEOLOGICAL MINERAL

(71) Applicant: China University of Petroleum (East China), Qingdao (CN)

(72) Inventors: Ying Song, Qingdao (CN); Ying Qi, Qingdao (CN); Jianlei Yang, Qingdao (CN)

( * ) Notice: Subject to any disclaimer, the term of this patent is extended or adjusted under 35 U.S.C. 154(b) by 408 days.

(21) Appl. No.: 16/709,237

(22) Filed: Dec. 10, 2019

(65) Prior Publication Data

US 2020/0142086 A1 May 7, 2020

Related U.S. Application Data

(63) Continuation of application No. PCT/CN2018/085974, filed on May 8, 2018.

(30) Foreign Application Priority Data

Jun. 13, 2017 (CN) .......................... 201710444285.1

(51) Int. Cl.
*G01V 1/18* (2006.01)
*A61H 7/00* (2006.01)
*A61H 23/02* (2006.01)

(52) U.S. Cl.
CPC .............. *G01V 1/18* (2013.01); *A61H 7/004* (2013.01); *A61H 23/0245* (2013.01); *A61H 2201/1418* (2013.01); *A61H 2201/165* (2013.01)

(58) Field of Classification Search
CPC .......... G01V 1/18; G01V 1/162; G01V 1/184; G01V 1/008; A61H 7/004; A61H 23/0245; A61H 2201/1418; A61H 2201/165; A61H 2023/0272; A61H 2201/1215; A61H 2201/50; A61H 2201/5043;

(Continued)

(56) References Cited

U.S. PATENT DOCUMENTS 5,356,369 A    10/1994  Yamasaki et al.
2017/0035212 A1*  2/2017  Erko ..................... A47C 27/083

FOREIGN PATENT DOCUMENTS

CN    200945036 Y    9/2007
CN    200989945 Y    12/2007

(Continued)

OTHER PUBLICATIONS

International Search Report of PCT/CN2018/085974, dated Jul. 18, 2018.

*Primary Examiner* — Kendra D Carter
*Assistant Examiner* — Arielle Wolff
(74) *Attorney, Agent, or Firm* — W&K IP

(57) ABSTRACT

This invention is about a detection device based on the piezoelectric property of geological minerals. The device has a vibration detector for compressing geological minerals to generate charges, so as to detect vibration and a physiotherapy jacket for carrying out quantitative physiotherapy on a human body by detecting the amount of charges. The system has the advantages of: being simple in structure, comprising the vibration detector and the physiotherapy jacket, using the piezoelectric property of geological minerals such as quartz and tourmaline, so as to realize detection of environmental vibration indoors, underground or in the field, and improving the safety factor of geological exploration operations.

5 Claims, 20 Drawing Sheets

(58) Field of Classification Search
CPC ........ A61H 23/0263; A61H 2201/5058; A61H 2201/5071; A61H 23/02; G01R 29/22; G01H 11/08
See application file for complete search history.

(56) References Cited

FOREIGN PATENT DOCUMENTS

| | | | | |
|---|---|---|---|---|
| CN | 101199439 | A | 6/2008 | |
| CN | 201488805 | * | 5/2010 | ............. G01H 11/08 |
| CN | 201488805 | U | 5/2010 | |
| CN | 102371922 | A | 3/2012 | |
| CN | 102611352 | A | 7/2012 | |
| CN | 204967667 | * | 1/2016 | ............... H02N 2/18 |
| CN | 204967667 | U | 1/2016 | |
| CN | 105515444 | A | 4/2016 | |
| CN | 107007092 | A | 8/2017 | |
| CN | 107037479 | A | 8/2017 | |
| CN | 107063441 | A | 8/2017 | |
| CN | 107065002 | A | 8/2017 | |
| CN | 107065003 | A | 8/2017 | |
| CN | 107115107 | A | 9/2017 | |
| CN | 107271032 | A | 10/2017 | |
| CN | 107271800 | A | 10/2017 | |
| CN | 107290078 | A | 10/2017 | |
| CN | 107290483 | A | 10/2017 | |

\* cited by examiner

DETECTION DEVICE BASED ON THE PIEZOELECTRIC PROPERTY OF GEOLOGICAL MINERAL

CROSS-REFERENCE TO RELATED APPLICATIONS

This application is a continuation of International Patent Application No. PCT/CN2018/085974 with a filing date of May 8, 2018, designating the United States, now pending, and further claims priority to Chinese Patent Application No. 201710444285.1 with a filing date of Jun. 13, 2017. The content of the aforementioned applications, including any intervening amendments thereto, are incorporated herein by reference.

TECHNICAL FIELD

The invention relates to a detection device based on the piezoelectricity of geological minerals.

BACKGROUND OF TECHNIQUES

In the prior art, the piezoelectricity of minerals refers to the characteristic that a mineral crystal generates a charge when it is under compressional stress. Some natural minerals such as quartz and tourmaline are the most common and most sensitive piezoelectric minerals. There are often natural disasters such as earthquakes, landslides, mudslides, and collapses because the geological field trips and/or explorations are mostly operated in remote mountainous areas, border areas, high altitude areas or underground with harsh environment and rough conditions. There are huge risks of geological activities due to poor natural conditions. Therefore, how to provide timely and effective warning in the earliest stage of geological disasters is the key to safe production.

The patent document of CN 104834014A discloses a radioactive mineral geological prospector, which is characterized by comprising a surface part and an underground instrument part. The surface part is connected to the underground instrument part by a single-core or four-core wire. The surface part includes a receiving control panel and power supply of which the receiving control panel is electrically connected to. The underground instrument part includes remote transmission and power supply unit, temperature and pressure magnetic positioning unit, natural gamma energy spectrum measurement unit and azimuth gamma measurement unit. The natural gamma energy spectrum measurement unit includes a composite detector and a natural gamma energy spectrum measurement circuit of which the composite detector is electrically connected to the natural gamma energy spectrum measurement circuit. A significant disadvantage of the prior art is that it is complicated to use the detector and hidden risks cannot be effectively detected.

SUMMARY OF THE INVENTION

In view of this, this invention is aimed to provide a detection device based on the piezoelectricity of geological minerals, which solves the technical problem of effectively detecting of hidden risks.

In order to achieve the above object, the technical solution of the invention is as follows: a vibration detector for compressing geological minerals to generate charges, so as to detect vibration, a physiotherapy jacket for carrying out quantitative physiotherapy on a human body by detecting the amount of charges, a bottom and a cover. An incompletely closed chamber is surrounded by the bottom and the cover. The physiotherapy jacket surrounds the entire exterior of the bottom and the cover. The vibration detector is located on the outer surface of the physiotherapy jacket. The bottom is slidably connected with a T-rail with a water storage tank on the right side of the lower bottom that can be pulled out from the right wall of the bottom through the T-rail. There is a compass on the right base of the bottom. A massage device can be found inside the bottom, of which there is a mounting base and stepping motor driving cam groups. An electric control module is set inside the bottom, including a cabinet with a sound generator inside, which is connected to the controller through a wire. The vibration detector has a cubic structure, which is composed of a lower box, an upper cover plate, a quartz piezoelectric sensor, compression springs, vibration blocks, movable polished rods, a central block and a vibration signal processor. There are four screw holes on the top of the lower box, and the upper cover plate is connected with the lower box by screws. Six quartz piezoelectric sensors distribute separately on the six inner surfaces of the cube-shaped chamber composed of the lower box and the upper cover plate. The outer ends of the six movable polished rods are vertically fixed to the corresponding quartz piezoelectric sensor surface respectively, while the opposite ends are respectively fixed on the central block in the middle. Six vibration blocks are respectively sleeved on the movable polished rods, with two compression springs sleeved at the two ends. The compression springs keep compressed when balanced. The six quartz piezoelectric crystals are connected to the vibration signal processor through connecting wires, and the vibration signal processor is connected to the controller through the connecting wires. The connecting wires enter into the bottom and the cover through the first through-hole and the second through-hole.

Compared with the prior art, the invention has the following outstanding substantive features and significant improvements:

Being simple in structure, comprising the vibration detector and the physiotherapy jacket, using the piezoelectric property of geological minerals such as quartz and tourmaline, so as to realize detection of environmental vibration indoors, underground or in the field, and improving the safety factor of geological exploration operations. During geological exploration operation, the present invention can detect a change in the environment in a timely manner, and give an early warning when major geological or natural disasters such as earthquakes or a mud rock flows occur, facilitating the operation personnel to take measures, in a timely manner, to prevent an accident from spreading, facilitating the timely evacuation and escape of the operation personnel, and avoiding personnel casualties. During daily geological exploration operation processes, the present invention can realize functions such as orientation, massage and tourmaline physiotherapy, preventing the occurrence of various occupational diseases.

INSTRUCTIONS OF THE INVENTION

Instructions of the invention are demonstrated here below with reference to the attached drawings and specific examples, so that the technicians in the art can better know about and use the invention. The examples are not intended to limit the use of the invention.

Figure 1:
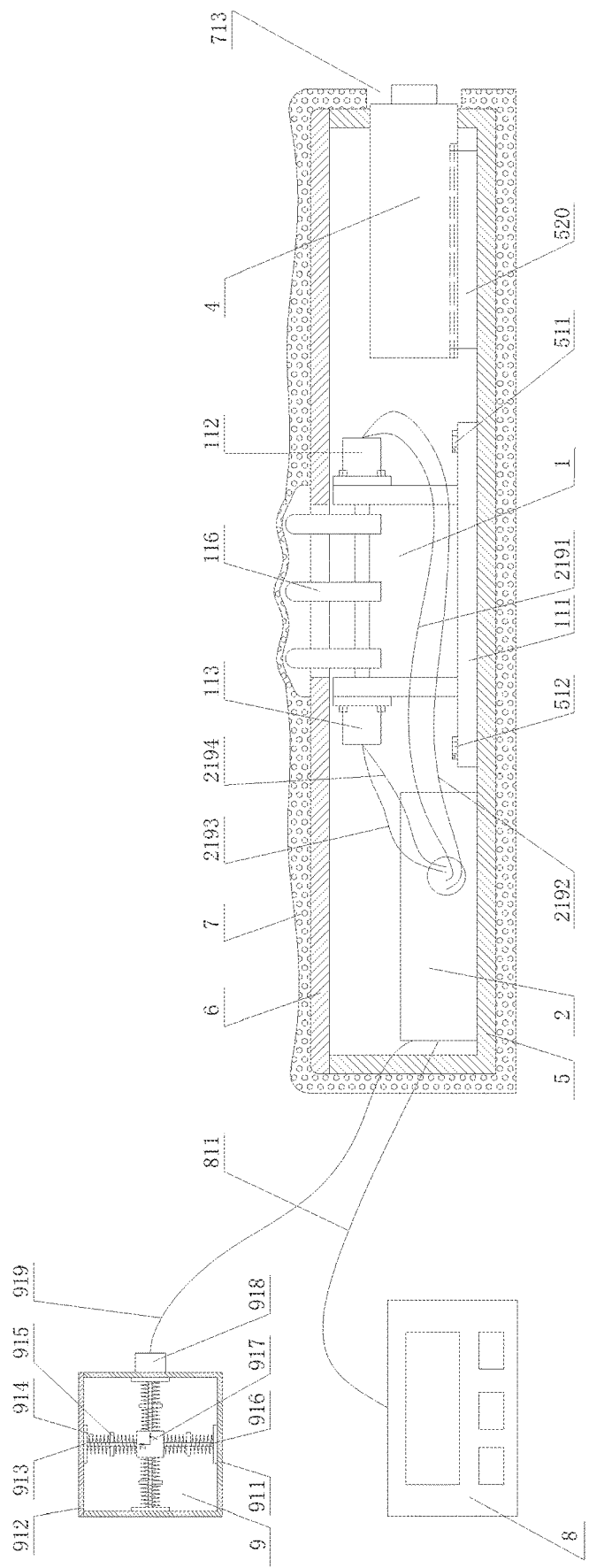
FIG. 1 is a schematic front view of a detection device based on the piezoelectric property of geological minerals.

Please refer to FIG. 1. The invention is a detection device based on the piezoelectric property of geological minerals, comprising a vibration detector for compressing geological minerals to generate charges, so as to detect vibration and a physiotherapy jacket for carrying out quantitative physiotherapy on a human body by detecting the amount of charges Preferably, there is a bottom and a cover of the device. An incompletely closed chamber is surrounded by the bottom and the cover. The physiotherapy jacket surrounds the entire exterior of the bottom and the cover. The vibration detector is located on the outer surface of the physiotherapy jacket. The bottom is slidably connected with a T-rail with a water storage tank on the right side of the lower bottom that can be pulled out from the right wall of the bottom through the T-rail. There is a compass on the right base of the bottom.

Figure 2:
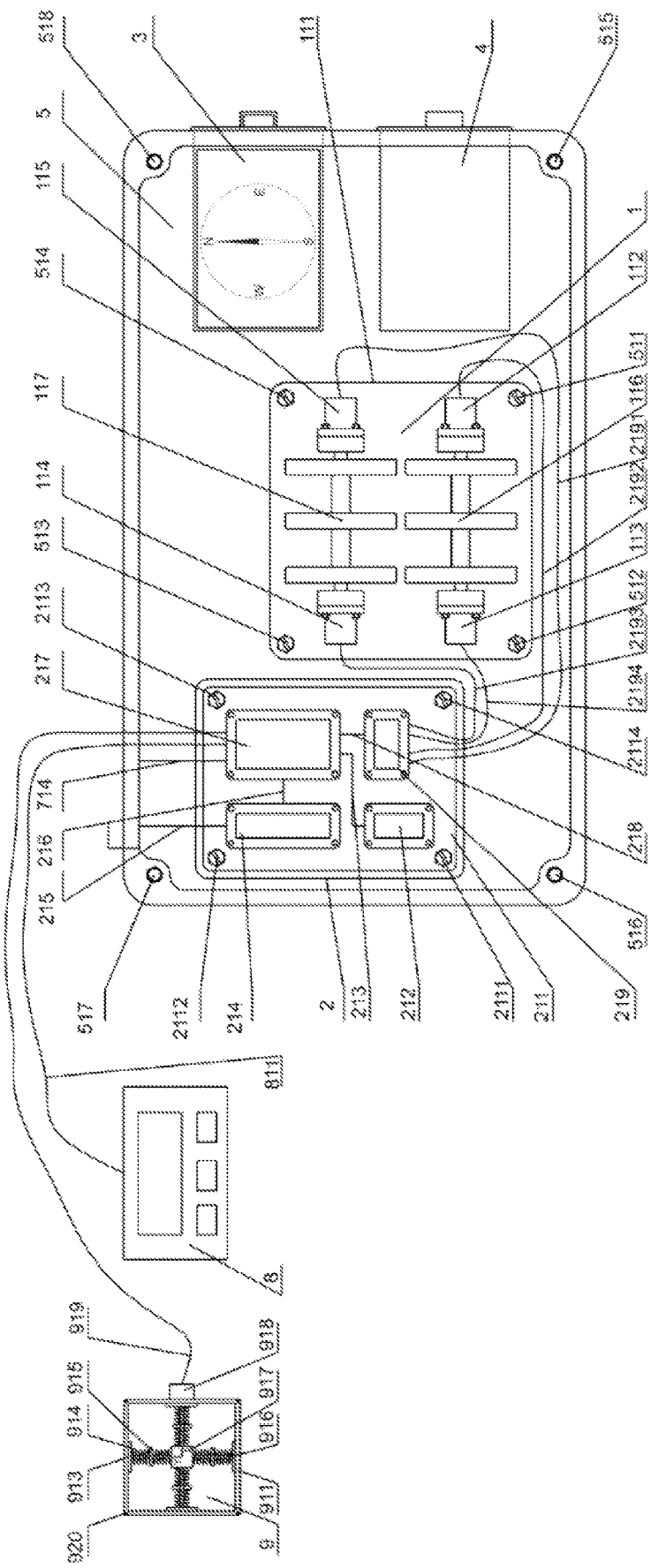
FIG. 2 is a schematic top view of a detection device based on the piezoelectric property of geological minerals when the cover is opened.

Preferably, a massage device can be found inside the bottom, of which there is a mounting base and stepping motor driving cam groups. The invention of a detection device based on the piezoelectric property of geological minerals is shown in FIG. 1 and FIG. 2. A detection device based on the piezoelectric property of geological minerals consists of a massage device 1, an electric control module 2, a compass 3, a water storage tank 4, a bottom 5, a cover 6, a physiotherapy jacket 7, an instruction input unit 8, and a vibration detector 9.

As shown in FIG. 2, FIG. 3, FIG. 4, FIG. 5, FIG. 6, and FIG. 18, inside the bottom 5 is the massage device 1 which is fixed to the base of the bottom 5 by screw 511, screw 512, screw 513, and screw 514. The electric control module 2 locates inside the bottom 5 and is fixed to the base of the bottom 5 by screw 2111, screw 2112, screw 2113, and screw 2114. The compass 3 is located on the right side of the lower bottom 5, slidably connected with a T-rail 519, and can be pulled out from the right wall of the bottom 5. The water storage tank 4 is 1 located on the right side of the lower bottom 5, slidably connected with a T-rail 520, and can be pulled out from the right wall of the bottom 5. The bottom 5 and the cover 6 are connected by screw 611, screw 612, screw 613, and screw 614 to form an incompletely closed chamber. The physiotherapy jacket 7 surrounds the entire exterior of the bottom 5 and the cover 6. The instruction input unit 8 and the vibration detector 9 are located outside the physiotherapy jacket 7.

Figure 7:
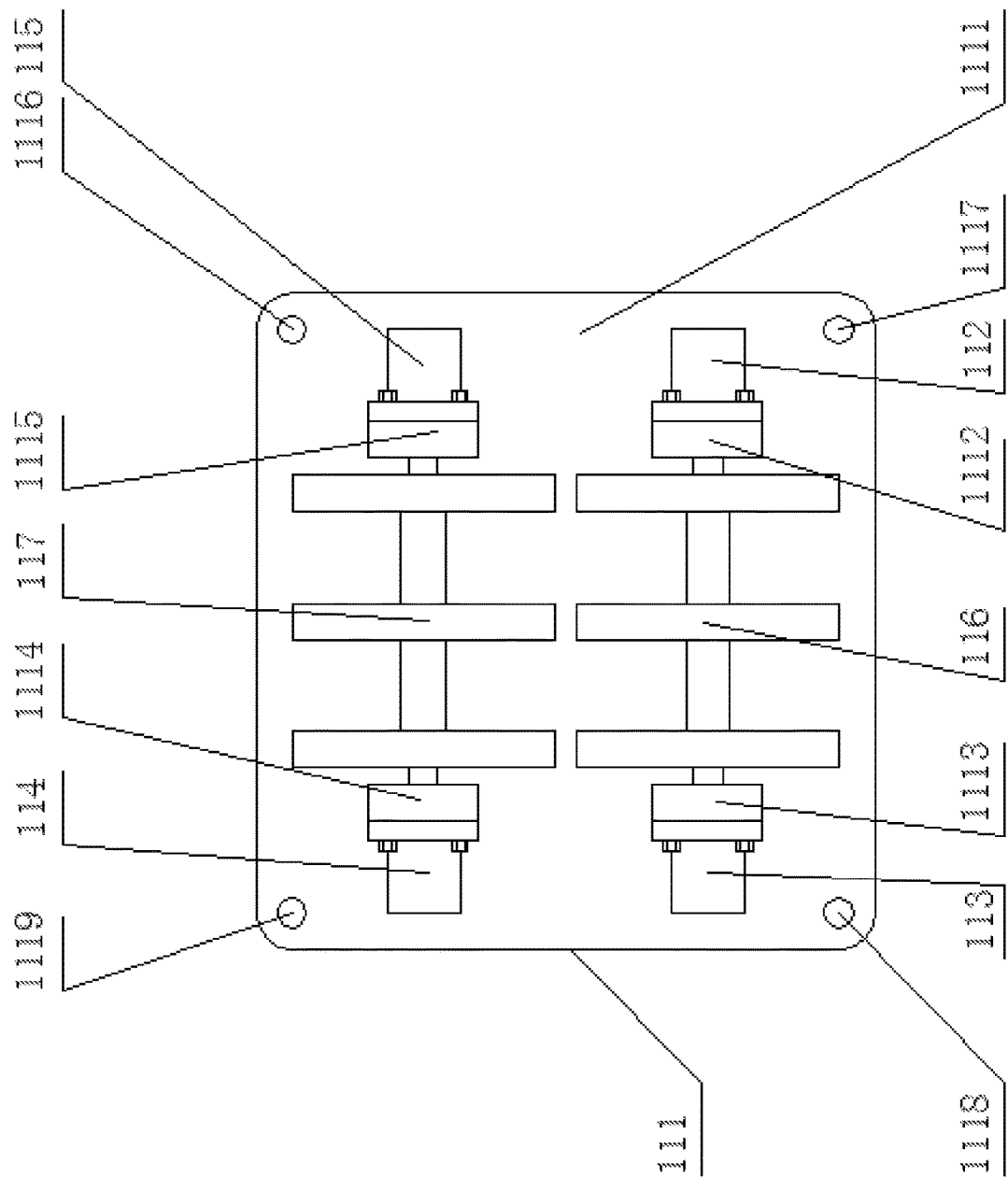
FIG. 7 is a schematic top view of the massage device of a detection device based on the piezoelectric property of geological minerals.

As shown in FIG. 7, the massage device 1 is composed of a mounting base 111, a stepping motor 112, a stepping motor 113, a stepping motor 114, a stepping motor 115, a cam group 116, and a cam group 117.

Figure 8:
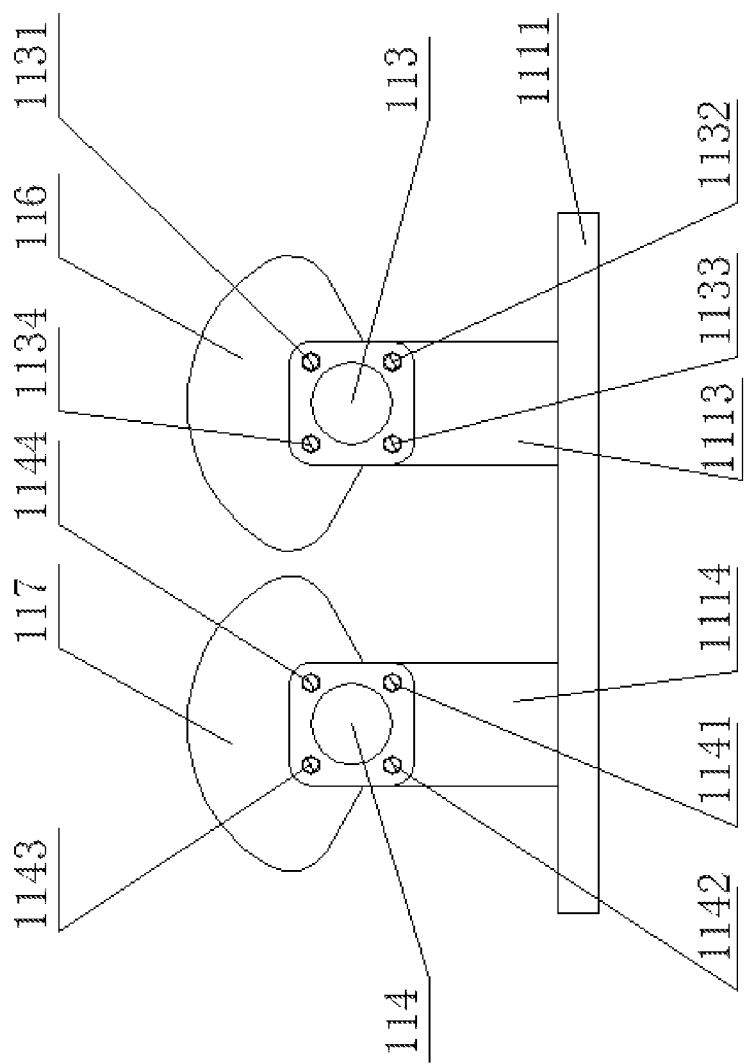
FIG. 8 is a schematic left view of the massage device of a detection device based on the piezoelectric property of geological minerals.
Figure 9:
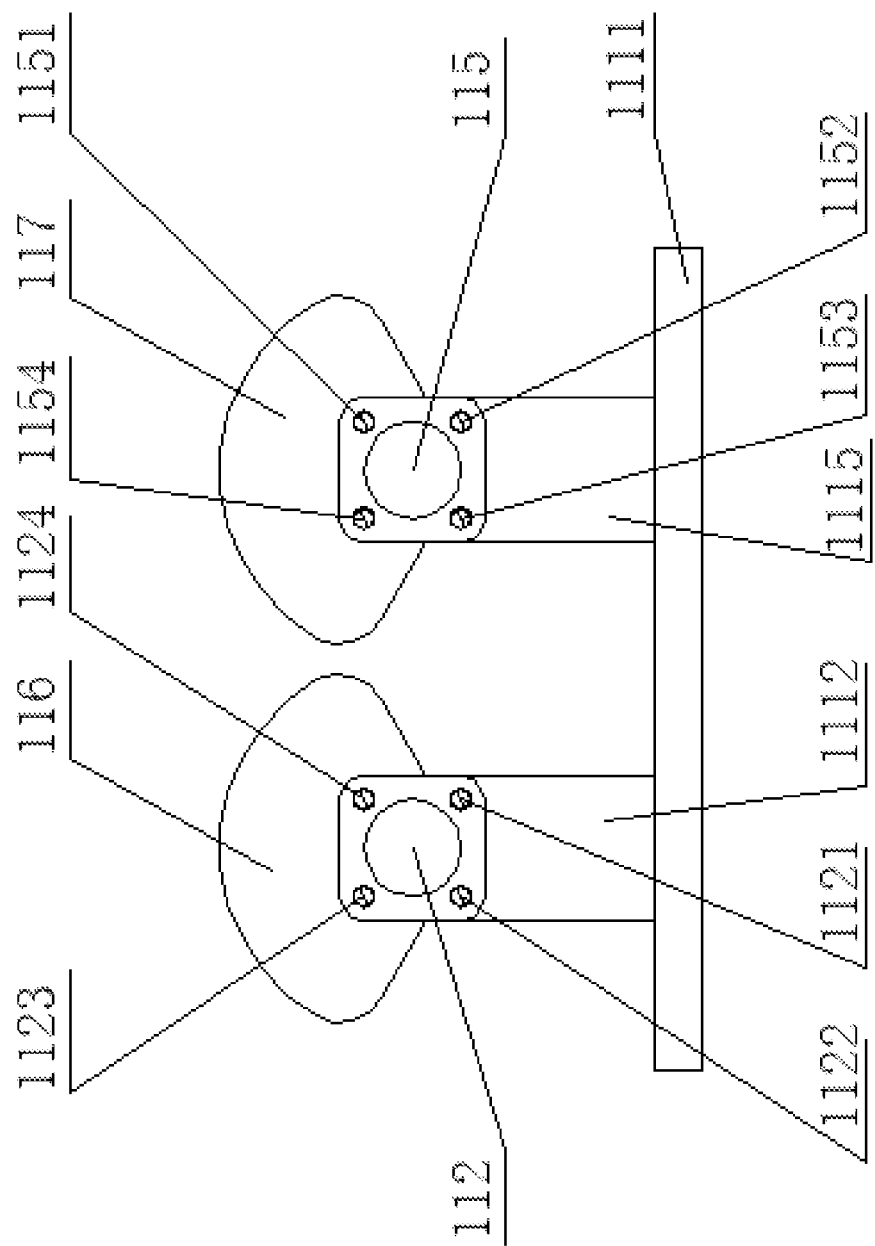
FIG. 9 is a schematic right view of the massage device of a detection device based on the piezoelectric property of geological minerals.
Figure 10:
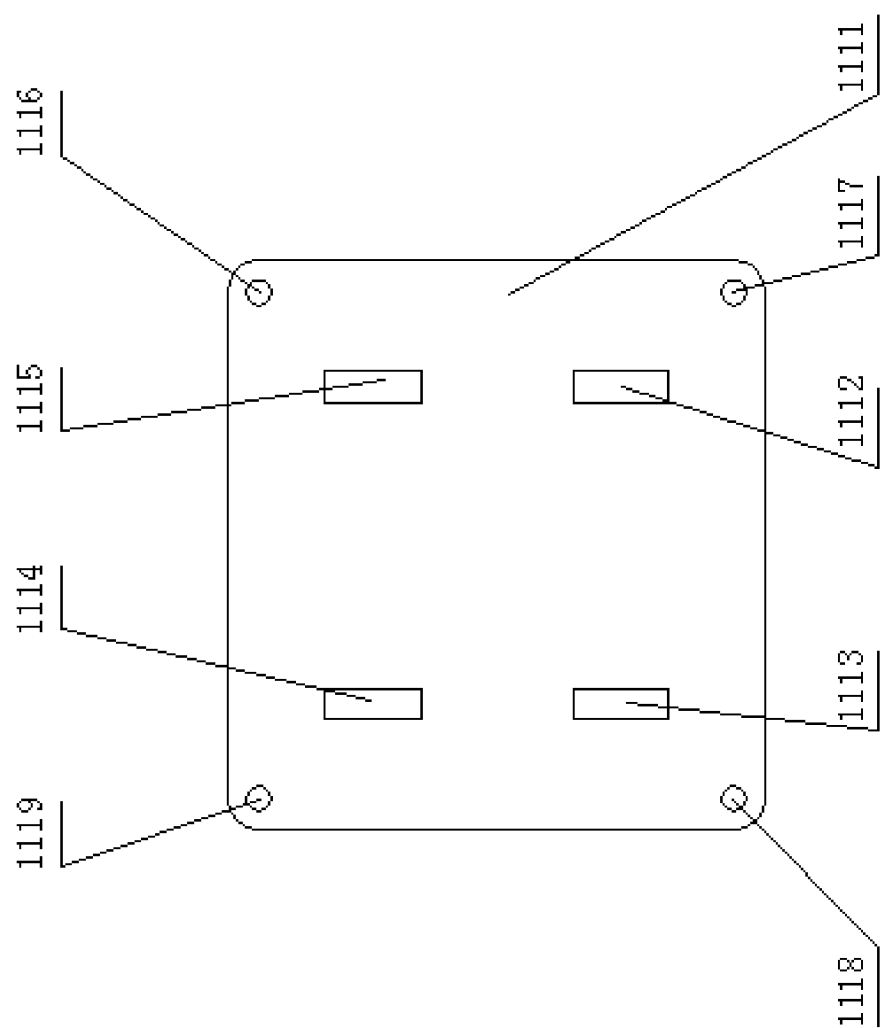
FIG. 10 is a schematic top view of the mounting base of a detection device based on the piezoelectric property of geological minerals.

As shown in FIG. 8, FIG. 9, and FIG. 10, the mounting base 111 is an integrated structure with a base 1111, a bracket 1112, a bracket 1113, a bracket 1114, and a bracket 1115; the base 1111 is a square plate with the four through-holes-through-hole 1116, through-hole 1117, through-hole 1118, and through-hole 1119 on each corner of the base 1111. The bracket 1112, the bracket 1113, the bracket 1114, and the bracket 1115 are exactly the same, and there is a round through-hole on the top of the brackets 1112, 1113, 1114, and 1115. The through-holes on the bracket 1112 and the bracket 1113 are coaxial, and the through-holes of the bracket 1114 and the bracket 1115 are coaxial, too. The axes of the through-holes on the bracket 1112 and the bracket 1115 are in the same horizontal plane. The stepping motor 112 is installed on the bracket 1112 with the screw 1121, screw 1122, screw 1123 and screw 1124; the stepping motor 113 is installed on the bracket 1113 with the screw 1131, screw 1132, screw 1133, and screw 1134; the stepping motor 114 is installed on the bracket 1114 with the screw 1141, screw 1142, screw 1143 and screw 1144; the stepping motor 115 is installed on the bracket 1115 with the screw 1151, screw 1152, screw 1153 and screw 1154. The output shaft of the stepping motor 112, stepping motor 113, stepping motor 114, and stepping motor 115 respectively pass through the through-holes on the bracket 1112, bracket 1113, bracket 1114 and bracket 115. The output shafts of the stepping motor 112 and stepping motor 113 are coaxial, and the output shafts of the stepping motor 114 and stepping motor 115 are coaxial. The output shafts of the stepping motor 112 and stepping motor 115 are in the same horizontal plane. The cam group 116 is installed on the output shafts of the stepping motor 112 and stepping motor 113. The square blind hole in the cam group 116 is in transition fit with the output shafts of the stepping motor 112 and stepping motor 113, and thus the cam group 116 rotates driven by the stepping motor 112 and stepping motor 113. The cam group 117 is installed on the output shafts of the stepping motor 114 and stepping motor 115. The square blind hole in the cam group 117 is in transition fit with the output shafts of the stepping motor 114 and stepping motor 115, and thus the cam group 117 rotates driven by the stepping motor 114 and stepping motor 115.

Figure 12:
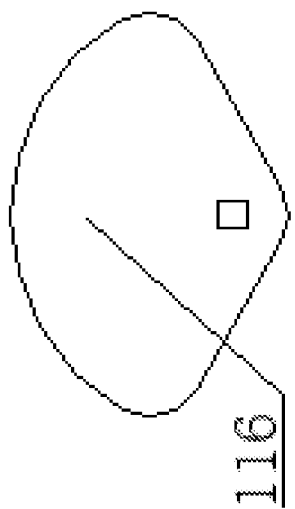
FIG. 12 is a schematic left view of the cam group of a detection device based on the piezoelectric property of geological minerals.
Figure 11:
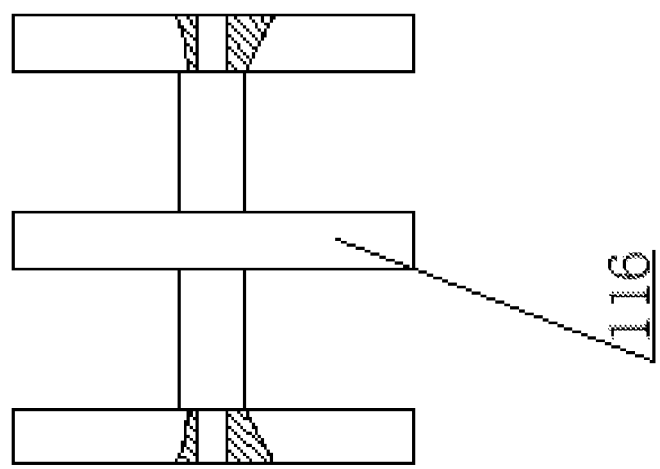
FIG. 11 is a schematic top view of the cam group of a detection device based on the piezoelectric property of geological minerals.

As shown in FIG. 11 and FIG. 12, the cam group 116 is integrated with three cams with the same axis and angle. The adjacent cams are connected with circular shafts, and there is a square blind hole on each side of the two outer cams. The axis of the square blind hole is coincided with that of the cam. The structure of the cam group 117 is the same as the cam group 116.

As shown in FIG. 2, the electric control module 2 is composed of a box 211, a sound generator 212, a power source 214, a controller 217, a stepping motor driver 219, and a charging interface 220. The box 211 is a rectangular parallelepiped box without cover. The sound generator 212, the power source 214, the controller 217, and the stepping motor driver 219 are all located inside the box 211, and the sound generator 212, the power source 214, the controller 217, and the stepping motor driver 219 are respectively fixed to the bottom of the box 211 by screws.

Figure 13:
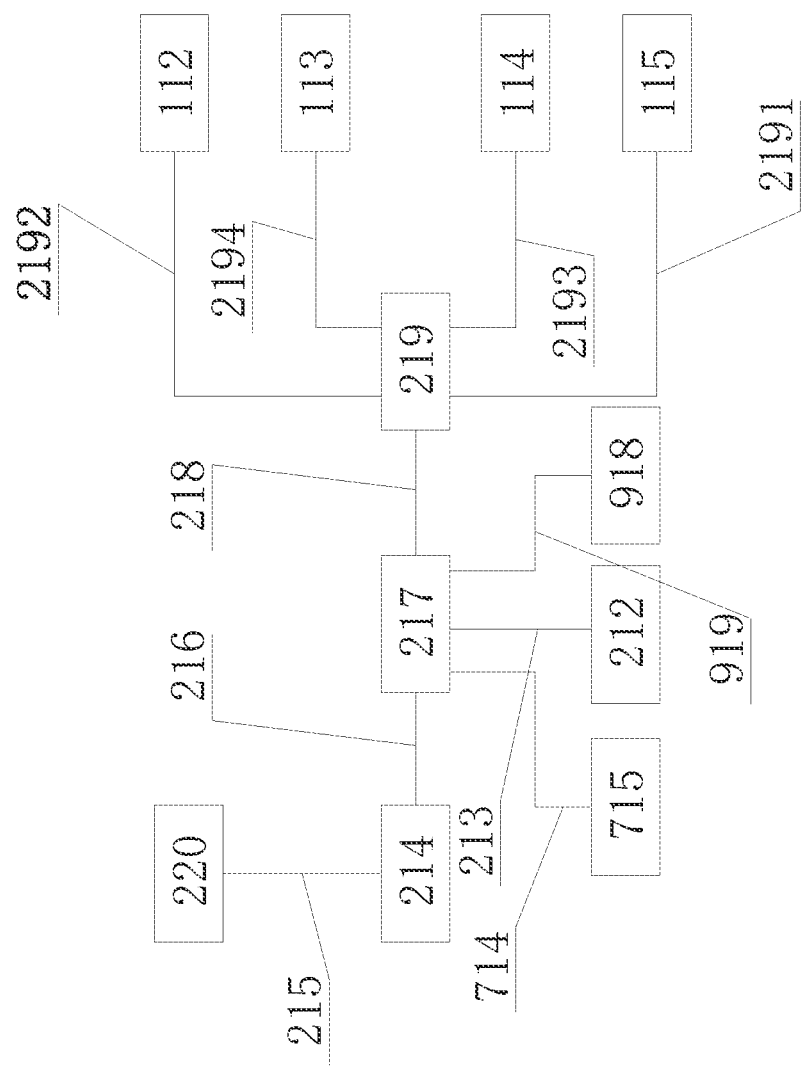
FIG. 13 is a wiring diagram of the electric control module of a detection device based on the piezoelectric property of geological minerals.

As shown in FIG. 13, the sound generator 212 and the controller 217 are connected by a wire 213; the power source 214 and the controller 217 are connected by a wire 216; the power source 214 and the charging interface 220 are connected by a wire 215; the controller 217 and the vibration signal processor 918 are connected by a wire 919; the controller 217 and the stepping motor driver 219 are connected by a wire 218; the stepping motor driver 219 and the stepping motor 112 are connected by a wire 2192; the stepping motor driver 219 and the stepping motor 113 are connected by a wire 2194; the stepping motor driver 219 and the stepping motor 114 are connected by a wire 2193; the stepping motor driver 219 and the stepping motor 115 are connected by a wire 2191; the tourmaline 715 on the physiotherapy jacket 7 and the controller 217 are connected by a wire 714.

Figure 15:
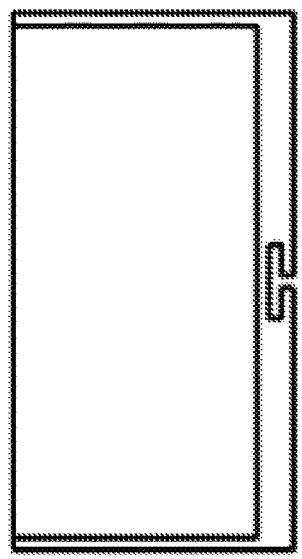
FIG. 15 is a schematic right view of the compass of a detection device based on the piezoelectric property of geological minerals.
Figure 14:
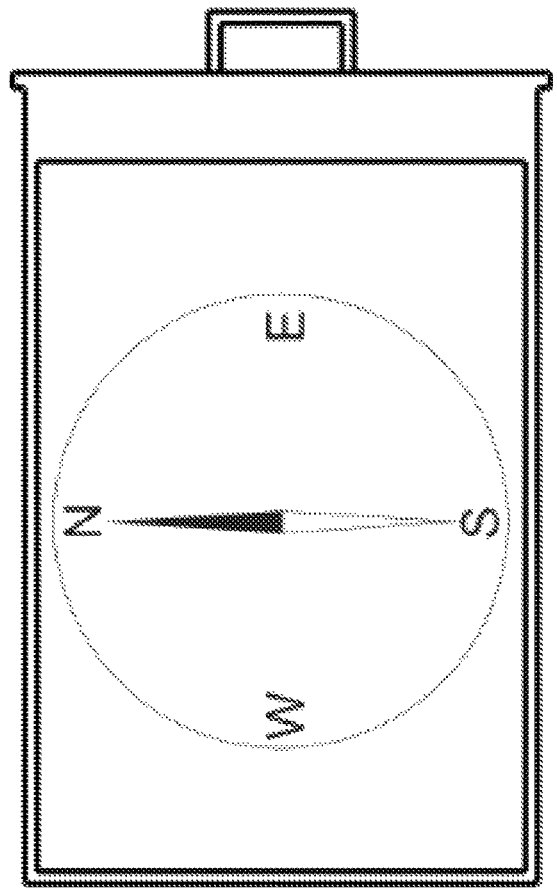
FIG. 14 is a schematic top view of the compass of a detection device based on the piezoelectric property of geological minerals.
Figure 20:
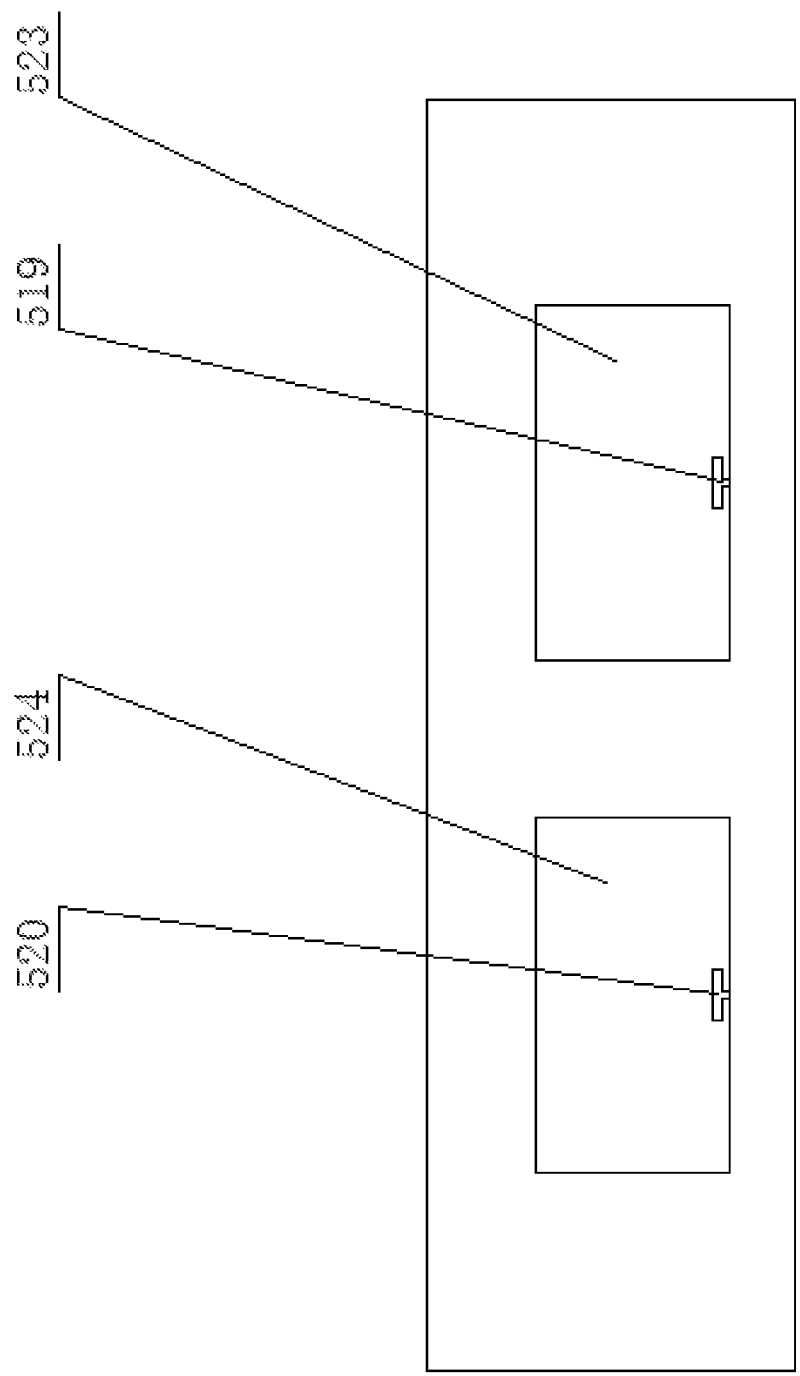
FIG. 20 is a schematic right view of the bottom of a detection device based on the piezoelectric property of geological minerals.

As shown in FIG. 14, FIG. 15, and FIG. 20, the compass 3 is a rectangular parallelepiped box without cover. There is a T-shaped groove at the bottom of the compass 3, matching the T-rail 519. The compass 3 moves on the T-rail 519 through the through-hole 523.

Figure 17:
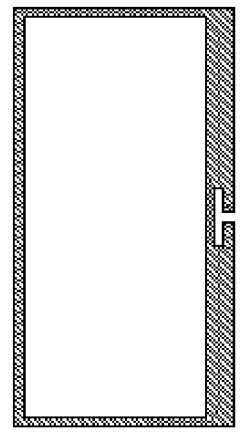
FIG. 17 is a schematic right view of the water storage tank of a detection device based on the piezoelectric property of geological minerals.
Figure 16:
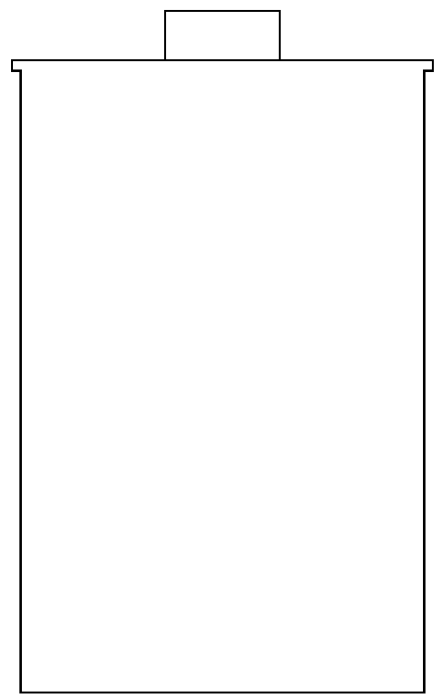
FIG. 16 is a schematic top view of the water storage tank of a detection device based on the piezoelectric property of geological minerals.

As shown in FIG. 16, FIG. 17, and FIG. 20, the water storage tank 4 is a rectangular parallelepiped closed box. There is a T-shaped groove at the bottom of the water storage tank 4, matching the T-rail 520. The water storage tank 4 moves on the T-rail 520 through the through-hole 524.

Figure 18:
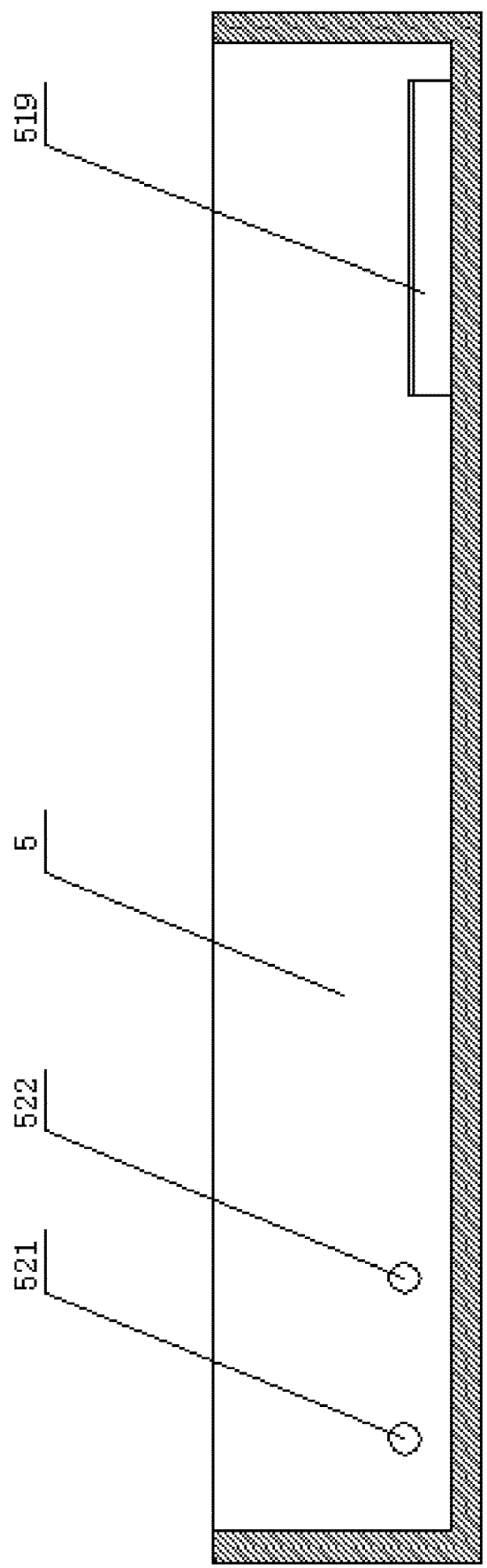
FIG. 18 is a schematic front view of the bottom of a detection device based on the piezoelectric property of geological minerals.
Figure 19:
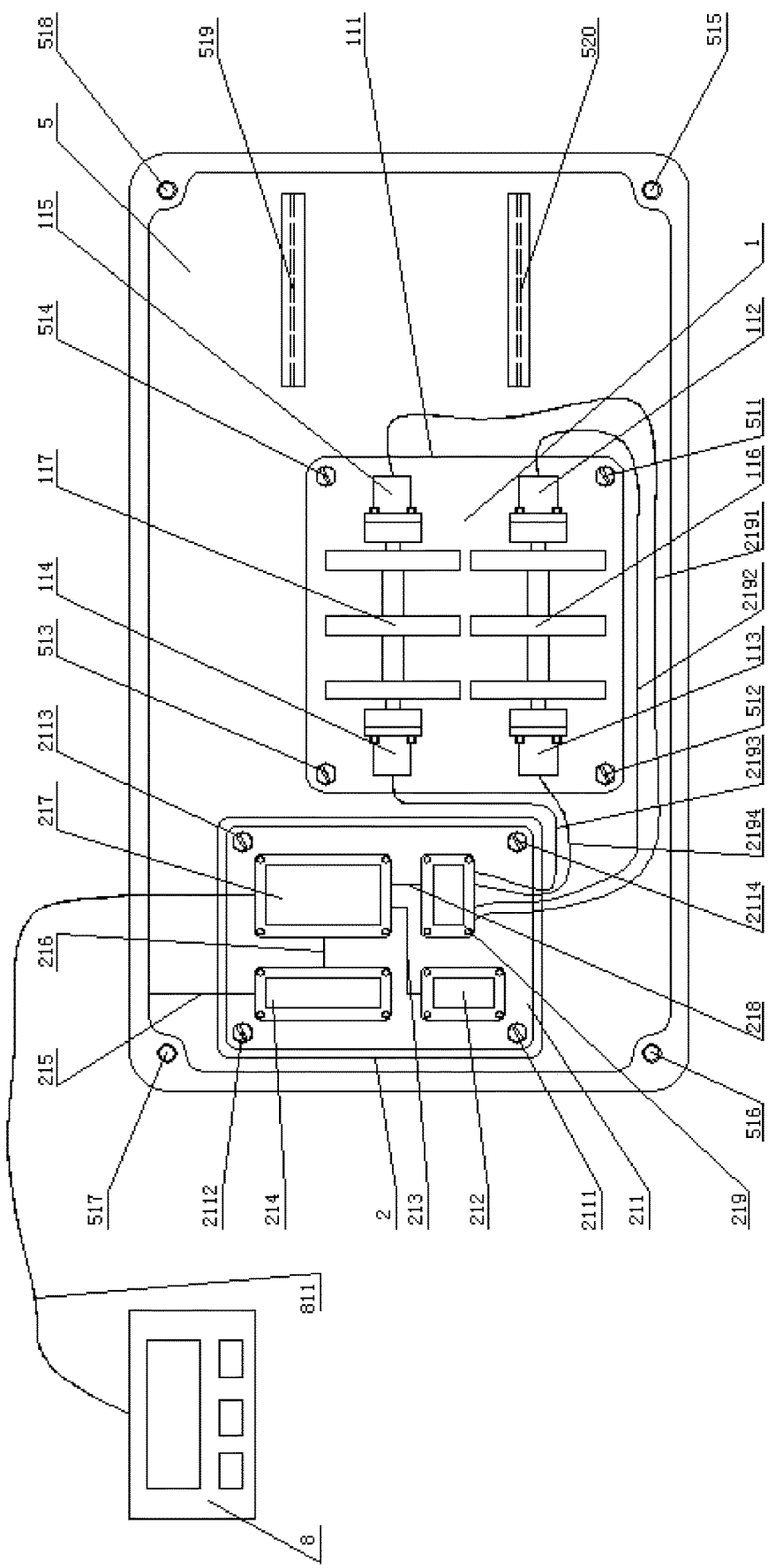
FIG. 19 is a schematic top view of the guide rail of a detection device based on the piezoelectric property of geological minerals.

As shown in FIG. 18, FIG. 19, and FIG. 20, the bottom 5 is a rectangular parallelepiped box structure without cover.

The four screw holes-screw hole 515, screw hole 516, screw hole 517, and screw hole 518—distribute at the four corners of the bottom 5. The T-rail 519 and T-rail 520 locate on the right base of the bottom 5. There are through-hole 521 and through-hole 522 on the rear wall of the bottom 5, and through-holes 523 and through-hole 524 on the right wall of the bottom 5. The compass 3 is inserted into the bottom 5 through the through-hole 523, while the water storage tank 4 is inserted into the bottom 5 through the through-hole 524. The charging interface 220 of the power source 214 is in the through-hole 521.

Figure 5:
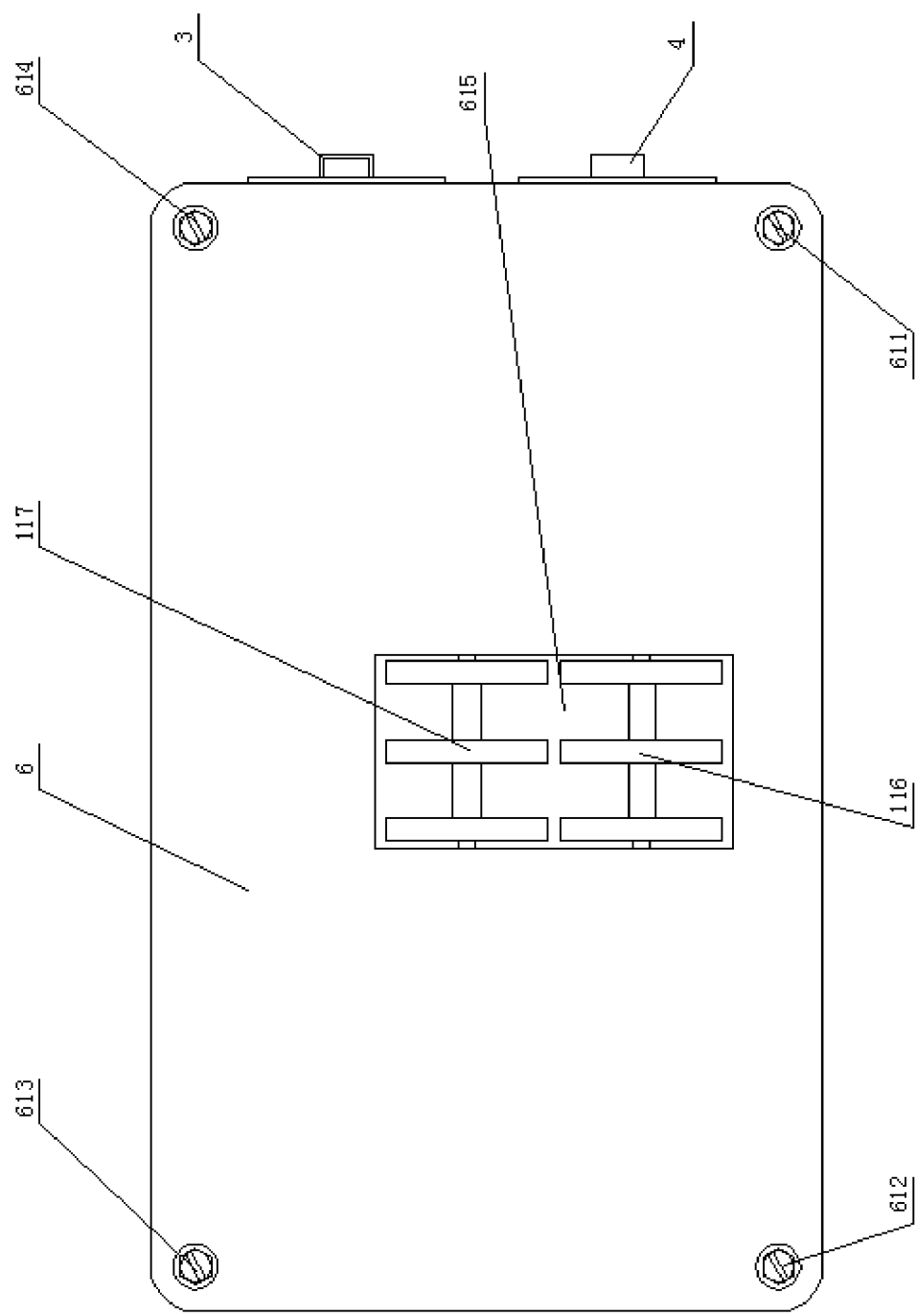
FIG. 5 is a schematic top view of a detection device based on the piezoelectric property of geological minerals when the shell is removed.
Figure 6:
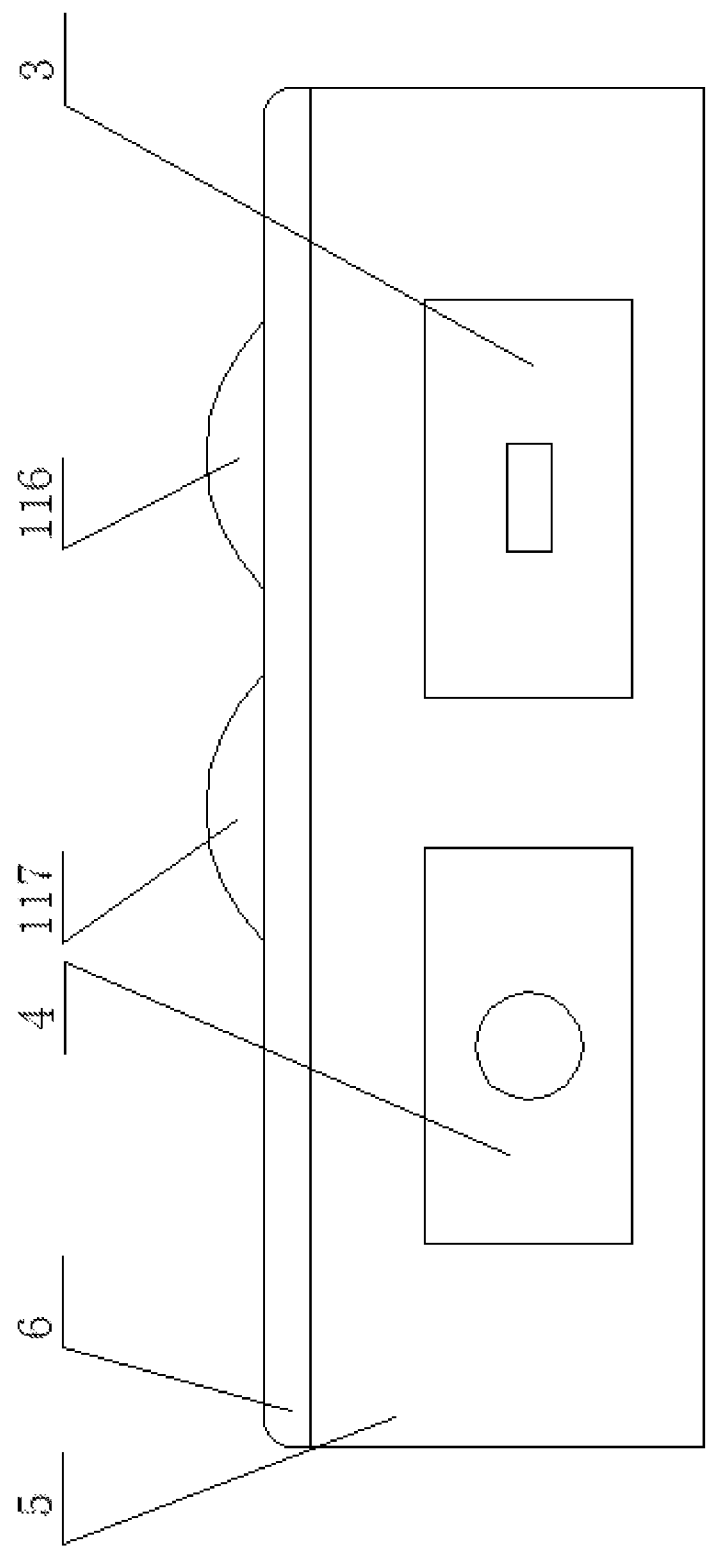
FIG. 6 is a schematic right view of a detection device based on the piezoelectric property of geological minerals when the shell is removed.

As shown in FIG. 5, the cover 6 is a rectangular plate. There are four screw holes fitting for the screw 611, screw 612, screw 613, and screw 614 on the four corners. There is also a rectangular through-hole 615 on the cover 6 for the cam group 116 and the cam group 117.

Figure 3:
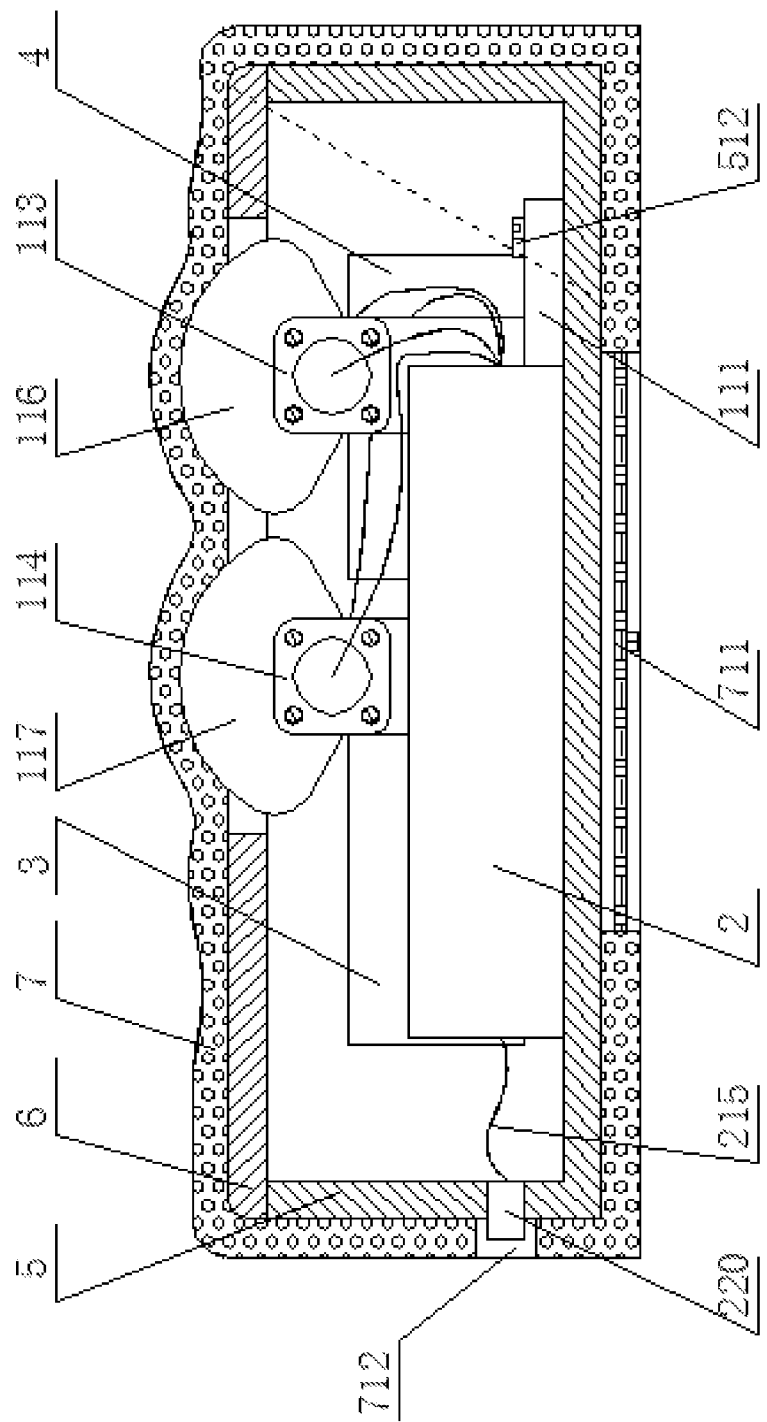
FIG. 3 is a schematic left view of a detection device based on the piezoelectric property of geological minerals.
Figure 4:
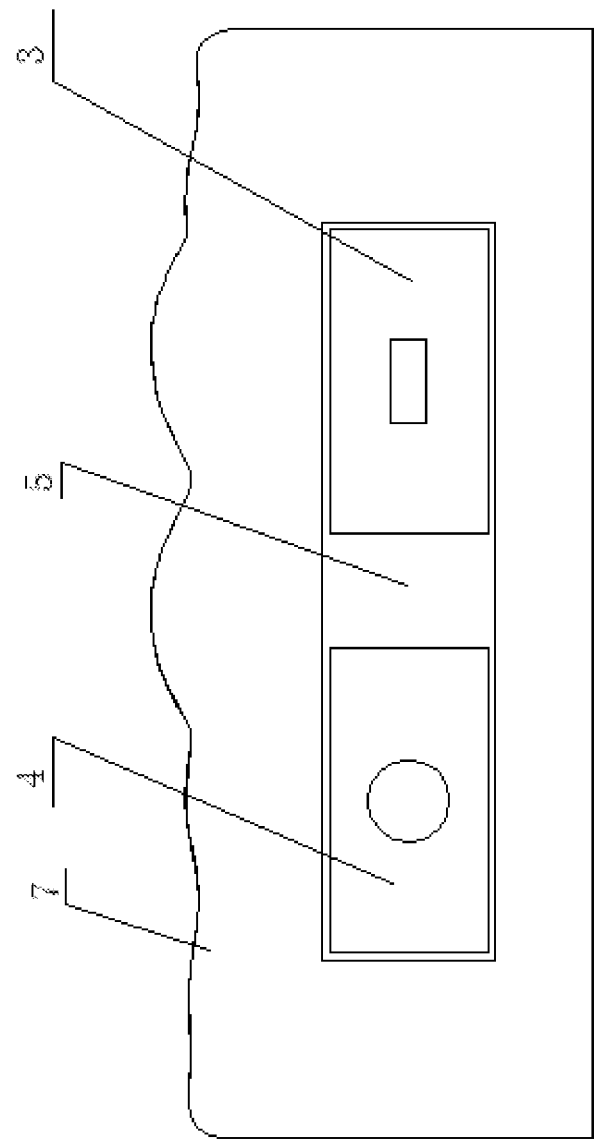
FIG. 4 is a schematic right view of a detection device based on the piezoelectric property of geological minerals.
Figure 21:
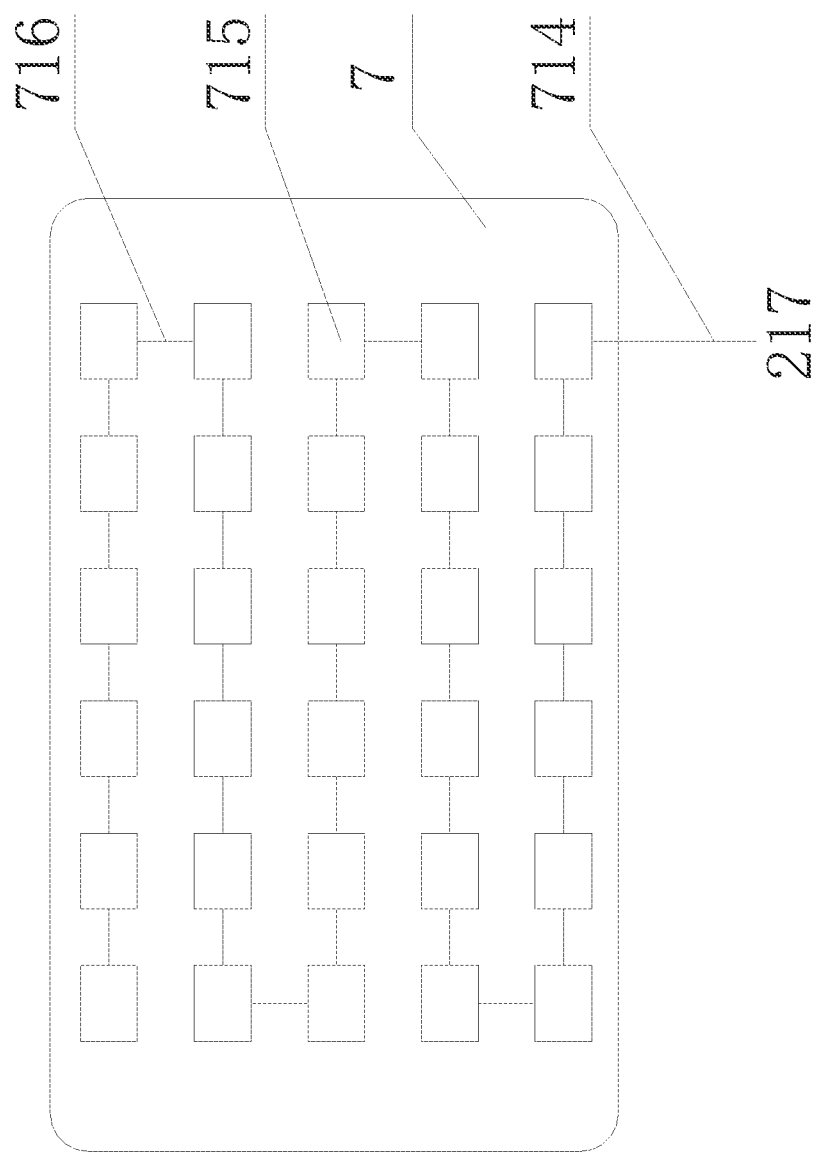
FIG. 21 is a schematic top view of the physiotherapy jacket of a detection device based on the piezoelectric property of geological minerals.

As shown in FIG. 1, FIG. 3, and FIG. 21, the physiotherapy jacket 7 is made of soft cloth. The physiotherapy jacket 7 is a rectangular parallelepiped closed box. There is a through-hole 712 on the back wall of the physiotherapy jacket 7, where the through-hole 521 and the through hole 522 can be exposed. There is a through-hole 713 on the right wall of the physiotherapy jacket 7, where the compass 3 and the water storage tank 4 can be exposed. There is a zipper 711 on the bottom of the physiotherapy jacket 7. The tourmaline 715 locates on the top surface of the physiotherapy jacket 7 and can be used for physical therapy. The tourmaline 715 is connected by a wire 716, and finally connected to the controller 217 by a wire 714.

As shown in FIG. 2, FIG. 3, and FIG. 18, the instruction input unit 8 is connected to the controller 217 through a wire 811, and the wire 811 passes into the device through the through-hole 712 and the through-hole 522.

Figure 22:
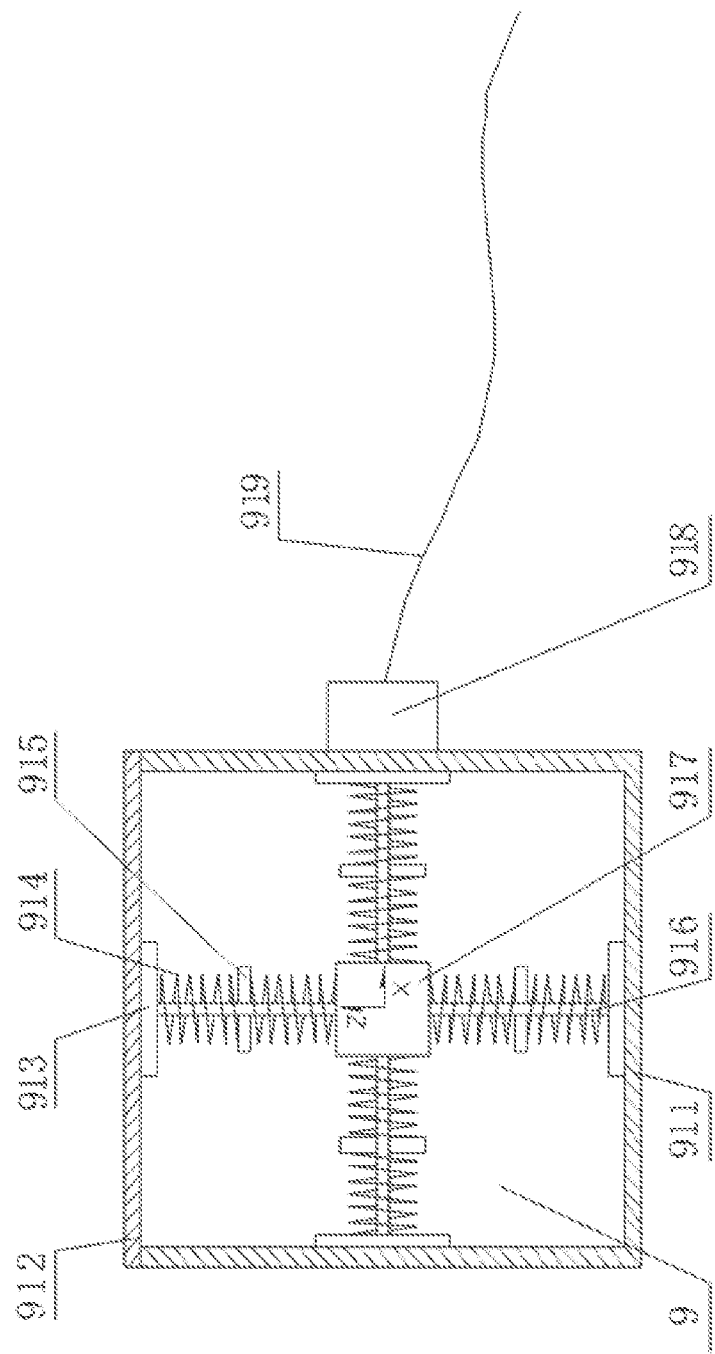
FIG. 22 is a schematic front view of the vibration detector of a detection device based on the piezoelectric property of geological minerals.
Figure 23:
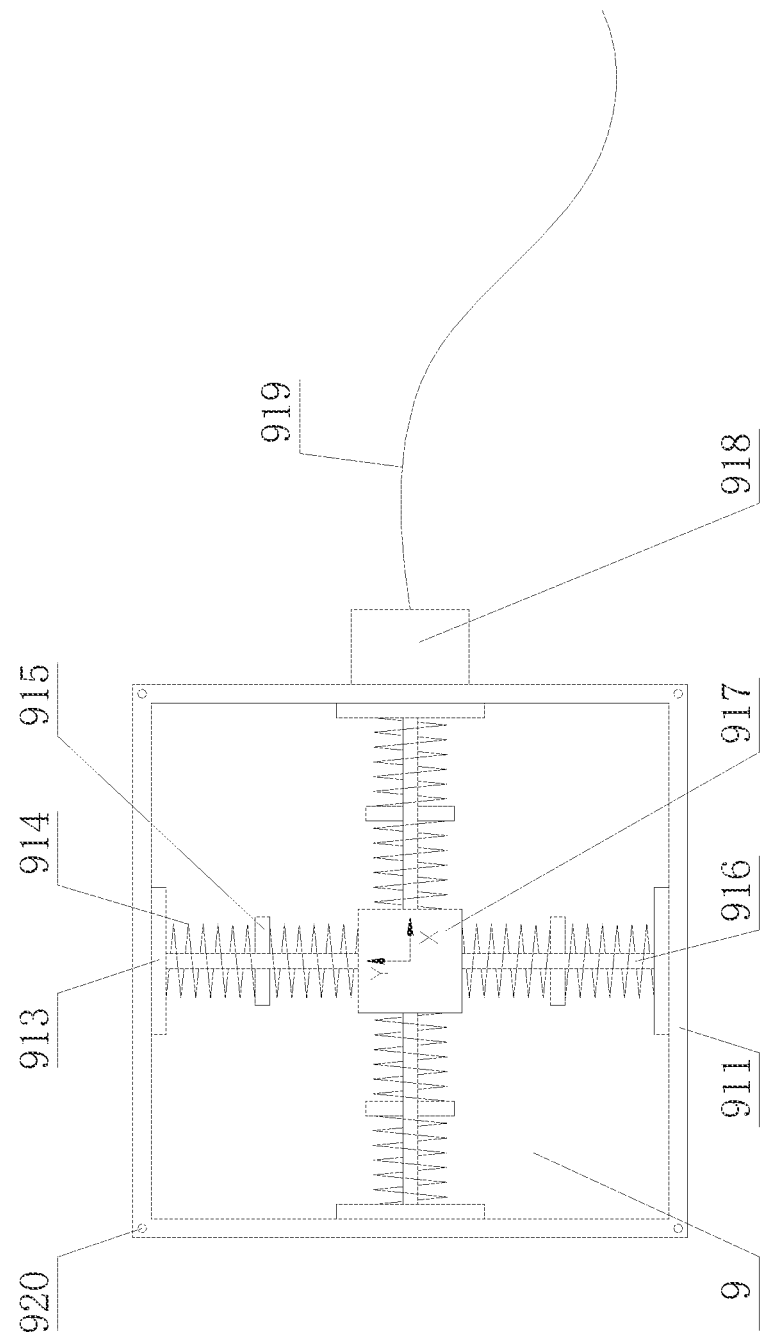
FIG. 23 is a schematic top view of the vibration detector of a detection device based on the piezoelectric property of geological minerals when the cover is removed.

As shown in FIG. 22 and FIG. 23, the vibration detector 9 is a cubic box, composed of a lower box 911, an upper cover plate 912, a quartz piezoelectric sensor 913, compression springs 914, vibration blocks 915, movable polished rods 916, a central block 917 and a vibration signal processor 918. There are four screw holes 920 on the top of the lower box 911, and the lower box 911 is connected to the upper cover plate 912 by screws. Six quartz piezoelectric sensors 913 distribute separately on the six inner surfaces of the cube-shaped chamber composed of the lower box 911 and the upper cover plate 912. The outer ends of the six movable polished rods 916 are vertically fixed to the corresponding quartz piezoelectric sensor 913 surface respectively, while the opposite ends are respectively fixed on the central block 917 in the middle. Six vibration blocks 915 are respectively sleeved on the movable polished rods 916, with two compression springs 914 sleeved at movable polished rods 916 to the two ends of the vibration block 915. The compression springs 914 keep compressed when balanced. The six quartz piezoelectric crystals 913 are connected to the vibration signal processor 918 through connecting wires, and the vibration signal processor 918 is connected to the controller 217 through the connecting wire 919. The connecting wire 919 enters into the bottom 5 and the cover 6 through the through-hole 712 and the through-hole 522.

The invention provides a detection device based on the piezoelectric property of geological minerals, including a vibration detector for compressing geological minerals to generate charges, so as to detect vibration and a physiotherapy jacket for carrying out quantitative physiotherapy on a human body by detecting the amount of charges.

Preferably, the instruction input unit 8 can send instructions for massage, music play, vibration detection, and physiotherapy detection. When a massage instruction is sent by the instruction input unit 8, it is transmitted to the controller 217 via the connecting wire 811, and then transmitted to the stepping motor driver 219 from the controller 217 via the connecting wire 218. The driving signals will be transmitted by the stepping motor driver 219 to the stepping motor 112, the stepping motor 113, the stepping motor 114 and the stepping motor 115 for rotating via the connecting wire 2192, the connecting wire 2194, the connecting wire 2193 and the connecting wire 2191. In order to improve the massage effect, increase the intensity of the massage, and reduce the volume of the device, the synchronization technique is adopted for the stepping motor driver, so that the cam group 116 and the cam group 117 generate vibrations from the coaxial dual motors with considerable vibrations.

The music play instruction is sent by the instruction input unit 8 and transmitted to the controller 217 via the wire 811. The music play instruction is transmitted to the sound generator 212 from the controller 217 through the wire 213, and the sound generator 212 emits a sound.

The vibration detection instruction is sent by the instruction input unit 8 and transmitted to the controller 217 through the wire 811. The circuit of the vibration detector 9 controlled by controller 217 is turned on, and the vibration detector 9 starts to work. The vibration blocks 915 inside the vibration detector 9 vibrates and compresses the compression springs 914 in a vibrating environment, such as earthquakes, mudslides, and collapses, etc. Signal is generated when the quartz piezoelectric sensor 913 is under lateral (X or Y) and longitudinal (Z) pressures caused by the compression springs 914. The signal is processed by the vibration signal processor 918 and transmitted to the controller 217 through the wire 919. On the one hand, the controller 217 sends an alarm instruction to the sound generator 212 through the wire 213 so that sounds are generated by the sound generator 212. On the other hand, instruction is transmitted to the stepping motor driver 219 through the wire 218, and the driving signals will be transmitted from stepping motor driver 219 to the stepping motor 112, stepping motor 113, stepping motor 114 and stepping motor 115 via wire 2192, wire 2194, wire 2193, and wire 2191 respectively. The stepping motor 112, stepping motor 113, stepping motor 114 and stepping motor 115 rotate to remind people.

The physiotherapy detection instruction is sent by the instruction input unit 8 and transmitted to the controller 217 through the wire 811. The circuit of the tourmaline 715 controlled by controller 217 is turned on. Due to the piezoelectric and pyroelectric characteristics of tourmaline 715, when the human body is touched with the physiotherapy jacket 7, the tourmaline 715 is under pressure, and electric charges will accumulate inside the tourmaline 715. Diverse voltages and currents are generated as the tourmaline 715 is compressed under different pressures within various durations. The voltages and currents are detected by the detector 217 through the wire 716 and wire 714, so that the physiotherapy time of the human body can be quantified and displayed on the screen of the instruction input unit 8.

The examples mentioned above are merely preferred for fully explaining of the invention. The protection scope of the invention is not confined to this. Equivalent substitutions or exchanges made by technicians in the art on the basis of the invention are all within the protection scope of the invention. The protection scope of the invention is subject to the claims.

We claim:

1. A detection device based on piezoelectric properties of geological minerals, which is characterized by comprising: a vibration detector for compressing geological minerals to generate charges, so as to detect vibration, a physiotherapy jacket configured for carrying out quantitative physiotherapy on a human body by detecting an amount of charges, a bottom and a cover; an incompletely closed chamber that is surrounded by the bottom and the cover;

wherein the physiotherapy jacket surrounds an entire exterior of the bottom and the cover;

wherein the vibration detector is located on an outer surface of the physiotherapy jacket;

wherein the bottom is slidably connected with a T-rail with a water storage tank on a right side of a lower bottom that can be pulled out from a right wall of the bottom through the T-rail; a compass on a right base of the bottom;

a massage device is inside the bottom, of which there is a mounting base and stepping motor driving cam groups; an electric control module is set inside the bottom, including a cabinet with a sound generator inside, which is connected to the electric control module through a wire, wherein the electric control module further comprises a vibrational signal processor;

wherein the vibration detector has a cubic structure, which is composed of a lower box, an upper cover plate, a quartz piezoelectric sensor, compression springs, vibration blocks, movable polished rods, a central block and a vibration signal processor, wherein the cubic structure comprises six inner surfaces;

four screw holes on a top of the lower box, and the upper cover plate is connected with the lower box by screws; six quartz piezoelectric sensors distribute separately on the six inner surfaces of the cubic structure composed of the lower box and the upper cover plate;

wherein outer ends of the movable polished rods are vertically fixed to corresponding quartz piezoelectric sensor surface respectively, while opposite ends are respectively fixed on the central block in a middle; six vibration blocks are respectively sleeved on the movable polished rods, with two compression springs sleeved at two ends;

wherein the compression springs keep compressed when balanced; wherein the six quartz piezoelectric crystals are connected to the vibration signal processor through connecting wires, and the vibration signal processor is connected to the controller through the connecting wires;

wherein the connecting wires enter into the bottom and the cover through a first through-hole and a second through-hole.

2. The detection device based on the piezoelectric property of geological minerals according to claim 1, characterized by, the physiotherapy jacket comprises a right wall, there are additional through-holes on the right wall of the physiotherapy jacket, and the compass and water storage tank are exposed through the through-holes.

3. The detection device based on the piezoelectric property of geological minerals according to claim 1, characterized by, a tourmaline crystal is installed on a top surface of the physiotherapy jacket, and the tourmaline crystal is connected to the controller through a wire.

4. The detection device based on the piezoelectric property of geological minerals according to claim 3, characterized by, the stepping motor is a coaxial dual motor.

5. The detection device based on the piezoelectric property of geological minerals according to claim 1, characterized by, each of the cam groups is integrated with three cams with a same axis and angle; wherein adjacent cams are connected with circular shafts.

* * * * *